(12) United States Patent
Nagaoka (10) Patent No.: US 9,862,190 B2
(45) Date of Patent: Jan. 9, 2018

(54) METHOD FOR MANUFACTURING LIQUID EJECTION HEAD

(71) Applicant: CANON KABUSHIKI KAISHA, Tokyo (JP)

(72) Inventor: Kyosuke Nagaoka, Kodaira (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/137,151

(22) Filed: Apr. 25, 2016

(65) Prior Publication Data

US 2016/0339704 A1 Nov. 24, 2016

(30) Foreign Application Priority Data

May 19, 2015 (JP) ................. 2015-101851

(51) Int. Cl.
| | |
|---|---|
| *H01L 21/02* | (2006.01) |
| *B41J 2/16* | (2006.01) |
| *B08B 3/08* | (2006.01) |
| *C11D 7/10* | (2006.01) |
| *C11D 7/50* | (2006.01) |
| *C11D 7/08* | (2006.01) |

(52) U.S. Cl.
CPC .......... *B41J 2/1631* (2013.01); *B41J 2/1603* (2013.01); *B41J 2/1623* (2013.01); *B41J 2/1628* (2013.01); *B41J 2/1629* (2013.01); *B41J 2/1639* (2013.01); *B41J 2/1642* (2013.01); *B41J 2/1645* (2013.01); *C11D 7/08* (2013.01); *C11D 7/10* (2013.01); *C11D 7/5004* (2013.01); *C11D 7/5009* (2013.01); *C11D 7/5013* (2013.01); *C11D 7/5022* (2013.01); *H01L 21/02063* (2013.01)

(58) Field of Classification Search
None
See application file for complete search history.

(56) References Cited

U.S. PATENT DOCUMENTS

| | | | |
|---|---|---|---|
| 5,478,606 A | 12/1995 | Ohkuma et al. | |
| 2008/0242574 A1* | 10/2008 | Rath | G03F 7/423 510/176 |
| 2009/0270300 A1* | 10/2009 | Uehara | C11D 7/08 510/175 |
| 2011/0300482 A1* | 12/2011 | Suzuki | C07C 381/12 430/270.1 |
| 2014/0013600 A1* | 1/2014 | Sakuma | B41J 2/1637 29/890.1 |

FOREIGN PATENT DOCUMENTS

| | | |
|---|---|---|
| JP | 6-286149 A | 10/1994 |
| JP | 2013-49007 A | 3/2013 |

\* cited by examiner

*Primary Examiner* — Seahvosh Nikmanesh
*Assistant Examiner* — Xiaoming Liu
(74) *Attorney, Agent, or Firm* — Fitzpatrick, Cella, Harper & Scinto (57) ABSTRACT

A method for manufacturing a liquid ejection head including a substrate having a terminal for electrical connection to an external device, an inorganic material layer on the substrate, and a flow path member disposed on the inorganic material layer and containing an organic material, and the manufacturing method includes a cleaning step of removing a silane coupling agent attached to the terminal by using a solution containing hydrogen fluoride, ammonium fluoride, and a water-soluble organic solvent.

12 Claims, 3 Drawing Sheets

METHOD FOR MANUFACTURING LIQUID EJECTION HEAD

BACKGROUND OF THE INVENTION

Field of the Invention

The present invention relates to a method for manufacturing a liquid ejection head.

Description of the Related Art

An inorganic material layer is provided on a substrate of a liquid ejection head for the purpose of serving as an insulating layer or a protective layer covering an energy-generating element or other purposes. On the other hand, it is known that a flow path member or other structures on the substrate are made of an organic material layer. In particular, an organic material layer of a photosensitive resin enables highly accurate patterning with photolithography. For example, Japanese Patent Application Laid-Open No. H06-286149 describes a manufacturing method for a liquid ejection head using photolithography.

SUMMARY OF THE INVENTION

The present invention is directed to providing a method for manufacturing a liquid ejection head including a substrate having a terminal for electrical connection to an external device, an inorganic material layer on the substrate, and a flow path member disposed on the inorganic material layer and containing an organic material, the manufacturing method comprising a cleaning step of removing a silane coupling agent attached to the terminal by using a solution containing hydrogen fluoride, ammonium fluoride, and a water-soluble organic solvent.

Further features of the present invention will become apparent from the following description of exemplary embodiments with reference to the attached drawings.

BRIEF DESCRIPTION OF THE DRAWINGS

FIGS. 2A, 2B, 2C, 2D, 2E, 2F, 2G, 2H, 2I and 2J are sectional views illustrating an example of the method for manufacturing a liquid ejection head according to the present invention.

DESCRIPTION OF THE EMBODIMENTS

Preferred embodiments of the present invention will now be described in detail in accordance with the accompanying drawings.

An inorganic material layer and an organic material layer tend to adhere together weakly. Thus, for example, an intermediate layer that can tightly adhere to the inorganic material layer and the organic material layer can be disposed between the inorganic material layer and the organic material layer. The intermediate layer can contain a silane coupling agent in order to enhance adhesion between the inorganic material layer and the organic material layer. An additional process using the silane coupling agent may be performed before or after formation of the intermediate layer. Examples of a method for forming the intermediate layer include a patterning process of adding a photosensitive material to a composition of the intermediate layer, exposing the intermediate layer to light with a mask, and developing (wet etching) the intermediate layer. A process of patterning the intermediate layer by dry etching with, for example, $O_2$ plasma asking using a patterned positive-type photosensitive resin as a mask may also be employed. However, in view of advantages in costs obtained by reduction of the number of process steps, the former process is preferable.

However, in the case of patterning using development (wet etching), the silane coupling agent cannot be completely removed and remains on the substrate so that faulty connections might occur in electrical bonding for driving the energy-generating element. An intensive study of inventors of the present invention shows that detachment of leads readily occurs because of a low strength in bonding for connecting terminals on the substrate to leads such as TAB tapes. Thus, a cleaning process using a cleaning agent including hydrogen chloride, ammonium fluoride, and water described in Japanese Patent Application Laid-Open No. 2013-49007 was additionally performed. As the result, it was observed that the silane coupling agent remaining on the substrate was removed. However, it was found that a new problem of corrosion of terminals for lead connection occurs. Corrosion of terminals reduces the bonding strength to cause detachment of leads. In view of this, a new manufacturing method that can enhance the bonding strength of leads has been demanded.

The present invention has an object of providing a manufacturing method for a liquid ejection head that can suppress corrosion of a terminal even if a silane coupling agent for enhancing an adhesion strength between an inorganic material and an organic material is removed from the terminal.

<Liquid Ejection Head>

Figure 1A:
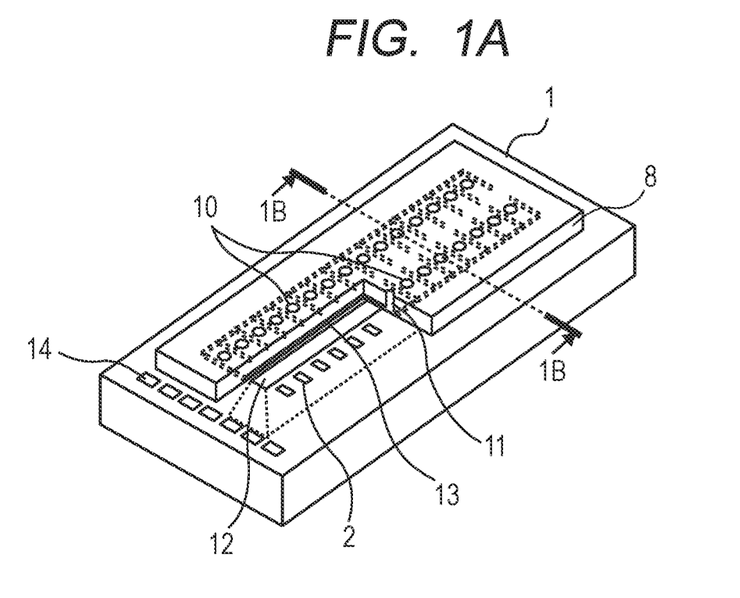
FIG. 1A is a perspective view illustrating an example of a liquid ejection head manufactured by a method according to the present invention.
Figure 1B:
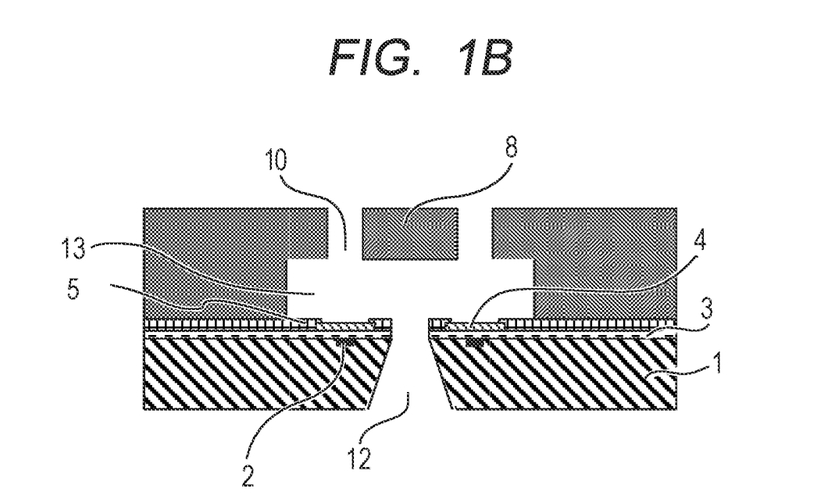
FIG. 1B is a sectional view taken along line IB-IB in FIG. 1A.

An example of a liquid ejection head manufactured by a method according to the present invention will be described with reference to FIGS. 1A and 1B. FIG. 1A is a perspective view illustrating an example of the liquid ejection head manufactured by the method according to the present invention. FIG. 1B is a sectional view taken along line 1B-1B in the liquid ejection head illustrated in FIG. 1A.

The liquid ejection head illustrated in FIGS. 1A and 1B includes a substrate 1 on which energy-generating elements 2 for generating energy for ejecting liquid are arranged at a predetermined pitch. Examples of the substrate 1 include a silicon substrate made of silicon. Preferably, the silicon substrate is single crystal of silicon and has a surface crystal orientation of (100). Examples of the energy-generating elements 2 include electrothermal transducing elements and piezoelectric elements. The energy-generating elements 2 may be arranged so as to come into contact with a surface of the substrate or so as to partially form space between the energy-generating elements 2 and the surface of the substrate 1. The energy-generating elements 2 are connected to control signal input electrodes (not shown) for allowing the energy-generating elements 2 to operate.

An inorganic material layer 3 and a protective layer 4 are formed on the surface of the substrate 1 on which the energy-generating elements 2 are arranged. The inorganic material layer 3 can function as a thermal storage layer or an insulating layer. The inorganic material layer 3 can be formed over the entire surface of the substrate 1. The protective layer 4 is a layer for protecting the energy-generating elements 2. The protective layer 4 may cover the entire energy-generating elements 2.

An intermediate layer 5 is formed on the inorganic material layer 3. A flow path member 8 including an organic material is formed on the intermediate layer 5. The term "on the inorganic material layer 3," for example, refers to a side of the inorganic material layer 3 above which an ejection orifice 10 is arranged. The intermediate layer 5 is located between the flow path member 8 and the inorganic material layer 3 and the protective layer 4, and can contact the inorganic material layer 3, the protective layer 4, and the flow path member 8. The intermediate layer 5 can enhance adhesion between the inorganic material layer 3 and the flow path member 8 and adhesion between the protective layer 4 and the flow path member 8. In FIGS. 1A and 1B, the flow path member 8 is a member forming a flow path 13 and an ejection orifice 10 for liquid. The substrate 1 has a supply port 12. Liquid supplied from the supply port 12 to the flow path 13 receives energy from the energy-generating elements 2, and is ejected from the ejection orifice 10. The substrate 1 includes terminals 14 for electrical connection to an external device outside the liquid ejection device, for example. In consideration of properties of electrical connection, none of the inorganic material layer 3, the intermediate layer 5, and the flow path member 8 is formed on the terminals 14.

The liquid ejection head manufactured by the method according to the present invention is preferable as an ink jet recording head for ejecting ink and recording on a recording medium.

<Method Manufacturing for Liquid Ejection Head>

A manufacturing method for the liquid ejection head according to the present invention will be described hereinafter. However, the present invention is not limited to this method.

An example of a manufacturing method for a liquid ejection head according to the present invention will be described with reference to FIGS. 2A to 2J. FIGS. 2A to 2J are sectional views illustrating a portion of the liquid ejection head illustrated in FIG. 1B and correspond to process steps of the manufacturing method for a liquid ejection head.

Figure 2A:
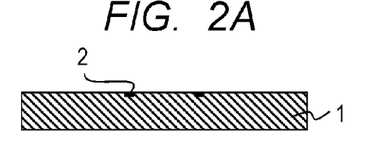

First, as illustrated in FIG. 2A, a substrate 1 having energy-generating elements 2 is prepared. In a manner similar to FIG. 1A, the substrate 1 has terminals (not shown) on its surface. The terminals preferably contain aluminium, and are more preferably made of aluminium.

Figure 2B:
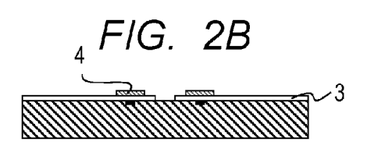

Next, as illustrated in FIG. 2B, an inorganic material layer 3 is formed on the substrate 1 to cover the energy-generating elements 2. A protective layer 4 is formed on the energy-generating elements 2. Examples of a material for the inorganic material layer 3 include silicon dioxide ($SiO_2$), silicon nitride (SiN), silicon carbide (SiC), and silicon carbonitride (SiCN). These materials may be used alone or two or more of these materials may be used in combination. The inorganic material layer 3 can be formed by forming a layer to be the inorganic material layer 3 by, for example, plasma CVD and then patterning the layer as necessary. Examples of a material for the protective layer 4 include Ta and Nb. These materials may be used alone or two or more of these materials may be used in combination. The protective layer 4 can be formed by forming a layer to be the protective layer 4 by, for example, sputtering and then patterning the layer as necessary. The inorganic material layer 3 has a thickness of 100 nm or more and 1000 nm or less. The protective layer 4 has a thickness of 100 nm or more and 1000 nm or less. To electrically connect circuit wiring to an external device, the inorganic material layer 3 and the protective layer 4 have openings in portions corresponding to the terminals.

Figure 2C:
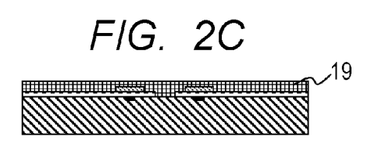

Then, as illustrated in FIG. 2C, a photosensitive material including a silane coupling agent is applied onto the substrate 1 having the terminals and the inorganic material layer 3 so that a layer 19 to be an intermediate layer is formed so as to come in contact with the inorganic material layer 3. The photosensitive material can include a photosensitive resin, a photopolymerization initiator, a silane coupling agent, and a solvent, for example.

The photosensitive resin is preferably an epoxy resin of a cationic photopolymerization type from the viewpoint of capability of development (wet etching), high mechanical strength, high resistance to liquid (ink), and high resolution, for example. Examples of the epoxy resin of a cationic photopolymerization type include a bisphenol An epoxy resin, a phenol novolac epoxy resin, a cresol novolac epoxy resin, and a polyfunctional epoxy resin having an oxycyclohexane skeleton. These materials may be used alone or two or more of these materials may be used in combination. The use of an epoxy resin having two or more functional groups enables three-dimensional bridge of a cured material so that desired properties can be easily obtained. In particular, from the viewpoint of high adhesion to the inorganic material layer 3, an epoxy resin, such as "GT-400 series" (trade name, produced by Daicel Corporation), having three or more cyclohexene oxide skeletons in a molecule, a cresol novolac epoxy resin such as "157S70" (trade name, produced by Mitsubishi Chemical Corporation), and "VG3101" (trade name, produced by Printec Co. Ltd.) are preferable.

Commercially available examples of the photopolymerization initiator include "Adeka Optomer SP-170" and "Adeka Optomer SP-172" (trade names, produced by ADEKA CORPORATION) and "CPI-210," "CPI-300," and "CPI-410" (trade names, produced by San-Apro Ltd.).

Examples of the silane coupling agent include: silane coupling agents including epoxy groups such as γ-glycidoxypropyltrimethoxysilane, γ-glycidoxypropylmethyldiethoxysilane, γ-glycidoxypropyltriethoxysilane, β-(3,4-epoxycyclohexyl)ethyltrimethoxysilane; silane coupling agents including amino groups such as N-β(aminoethyl)-γ-aminopropyltrimethoxysilane, N-β(aminoethyl)-γ-aminopropyltriethoxysilane, γ-β(aminoethyl)3-aminopropylmethyldimethoxysilane, γ-aminopropyltrimethoxysilane, γ-aminopropyltriethoxysilane, N-phenyl-γ-aminopropyltrimethoxysilane, N-phenyl-γ-aminopropyltriethoxysilane, γ-triethoxysilyl-N-(1,3-dimethyl-butylidene)propylamine, and N-(vinylbenzyl)-β-aminoethyl-γ-aminopropyltrimethoxysilane; silane coupling agents including isocyanate groups such as 3-isocyanate propyltrimethoxysilane and 3-isocyanate propyltriethoxysilane; and silane coupling agents including mercapto groups such as γ-mercapto propyltrimethoxysilane, γ-mercapto propylmethyldiethoxysilane, and γ-mercapto propyltrimethoxysilane. Commercially available examples of the silane coupling agent include "A-187" and "A-186" (product names, produced by Momentive Performance Materials Japan LLC.) and "KBM-303" and "KBM-402" (trade names, produced by Shin-Etsu Chemical Co., Ltd.).

Examples of the solvent include alkylene glycol monoalkyl ether carboxylate, alkylene glycol monoalkyl ether, lactic acid alkyl ester, alkoxy propionic acid alkyl, cyclic lactone (preferably with a carbon number of 4 to 10), a monoketone compound (preferably with a carbon number of 4 to 10) that may include a ring, alkylene carbonate, alkoxy acetic acid alkyl, pyruvic acid alkyl, and a compound including a benzene ring. These materials may be used alone, or two or more of these materials may be used in combination.

The content of the silane coupling agent in the photosensitive material is preferably 0.01 to 15.00 parts by mass and more preferably 2.00 to 8.00 parts by mass, with respect to 100 parts by mass of the photosensitive resin. The layer 19 to be an intermediate layer can be formed by, for example, applying a photosensitive material by spin coating and drying the photosensitive material by prebake. The layer 19 to be an intermediate layer preferably has a thickness 1 μm or more and 20 μm or less.

Figure 2D:
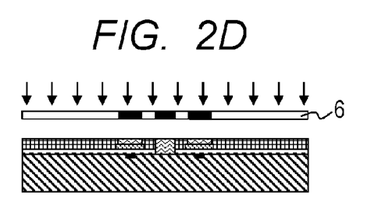

Thereafter, as illustrated in FIG. 2D, the layer 19 to be an intermediate layer is exposed to light using a mask 6. The light exposure can be performed with, for example, an i-ray exposure stepper. The mask 6 may be a mask obtained by forming a light-shielding film such as a chromium film in accordance with a pattern on a substrate made of, for example, glass or quartz through which light having an exposure wavelength passes so as not to expose an unexposed portion, e.g., the layer 19 to be an intermediate layer on the energy-generating elements 2. Subsequently, the layer 19 to be an intermediate layer is subjected to a heat treatment at a temperature greater than or equal to a softening point of the photosensitive resin. Such a heat treatment is called a post exposure bake (PEB) process. In a case where the photosensitive resin is a negative-type photosensitive resin, an exposed portion of the layer 19 to be an intermediate layer is cured. The PEB can be performed at 50 to 100° C. for 2 to 10 minutes, for example.

Figure 2E:
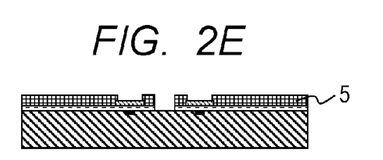

Then, as illustrated in FIG. 2E, the unexposed portion of the layer 19 to be an intermediate layer is developed (wet etched) with a developer, thereby forming an intermediate layer 5. Examples of the developer include methyl isobutyl ketone (MIBK) and xylene. These materials may be used alone or two or more of these materials may be used in combination. After the development, a rinsing process using isopropyl alcohol (IPA) and/or post bake may be performed as necessary. In the present invention, the intermediate layer 5 may not be formed.

The step of performing a treatment on the substrate with a silane coupling agent can be performed. This step can be performed before or after the step of forming the intermediate layer 5, for example. In this manner, adhesion between the inorganic material layer 3 or the flow path member 8 and the intermediate layer 5 can be enhanced. In the case of performing the treatment with the silane coupling agent, the photosensitive material as a material for the intermediate layer does not need to include the silane coupling agent, but preferably includes the silane coupling agent from the viewpoint of obtaining a higher degree of adhesion. The treatment with the silane coupling agent can be performed by applying the silane coupling agent with a spin coater and then drying the material by prebake, for example. The silane coupling agent may be an agent similar to the silane coupling agent contained in the photosensitive material.

Thereafter, the substrate 1 including the intermediate layer 5 is cleaned by using a solution (hereinafter also referred to as a cleaning solution) containing hydrogen fluoride, ammonium fluoride, and a water-soluble organic solvent. In this manner, the silane coupling agent attached to the terminals can be removed. In a case where the material for the intermediate layer 5 includes the silane coupling agent and/or a treatment with the silane coupling agent is performed before or after the step of forming the intermediate layer 5, the silane coupling agent that cannot be removed by development (wet etching) remains as a layer on the surfaces of the terminals. The residue of the layer of the silane coupling agent can be observed by performing mass spectrometry on the surfaces of the terminals with a time-of-flight secondary ion mass spectrometer (TOF-SIMS). In the present invention, cleaning with the cleaning solution can effectively remove the silane coupling agent remaining on the terminals without, for example, corrosion of the terminals for lead connection. In this manner, the bonding strength of the leads in the terminals can be enhanced.

The cleaning solution contains hydrogen fluoride. This hydrogen fluoride may be used in the state of hydrofluoric acid together with water. This hydrofluoric acid is an aqueous solution containing 40 to 60 mass % of hydrogen fluoride, and may be a commercially available product. Hydrogen fluoride can be generally obtained by using a reaction yielding hydrogen fluoride from fluorite ($CaF_2$) and sulfuric acid ($H_2SO_4$). From the viewpoint of obtaining a sufficient cleaning effect, the content of hydrogen fluoride in the cleaning solution is preferably 0.05 mass % or more, more preferably 0.07 mass % or more, and much more preferably 0.10 mass % or more. From the viewpoint of preventing corrosion in the surface of the substrate 1, the content of hydrogen fluoride is preferably 15.00 mass % or less, more preferably 5.00 mass % or less, and much more preferably 1.00 mass % or less.

The cleaning solution contains ammonium fluoride. Ammonium fluoride can be obtained by precipitation in ice-cold hydrofluoric acid using ammonia. Ammonium fluoride can be obtained by heating a mixture of ammonium chloride and sodium fluoride or a mixture of sulfuric acid ammonium and calcium fluoride to cause the mixture to sublime. From the viewpoint of obtaining a sufficient cleaning effect, the content of ammonium fluoride in cleaning solution is preferably 0.50 mass % or more, more preferably 0.70 mass % or more, and much more preferably 1.00 mass % or more. From the viewpoint of obtaining a sufficient cleaning effect and preventing precipitation from cleaning solution, the content is preferably 20.00 mass % or less, more preferably 10.00 mass % or less, and much more preferably 5.00 mass % or less.

From the viewpoint of obtaining a sufficient cleaning effect, the mass ratio (ammonium fluoride/hydrogen fluoride) of hydrogen fluoride and ammonium fluoride in the cleaning solution is preferably 1 or more and 15 or less, more preferably 1 or more and 10 or less, and much more preferably 2 or more and 10 or less. Since silica can be dissolved in hydrogen fluoride and ammonium fluoride described above, a specific composition of hydrogen fluoride and ammonium fluoride is expected to enable more efficient removal of the layer of the silane coupling agent.

The cleaning solution contains a water-soluble organic solvent. The water-soluble organic solvent may be a water-soluble organic solvent miscible with hydrogen fluoride. Examples of the water-soluble organic solvent include sulfoxides such as dimethyl sulfoxide, sulfones such as dimethyl sulfone, diethyl sulfone, and bis(2-hydroxyethyl) sulfone, lactams such as N-methyl-2-pyrolidone, N-ethyl-2-pyrolidone, N-propyl-2-pyrolidone, N-hydroxy methyl-2-pyrolidone, and N-hydroxyethyl-2-pyrolidone, imidazolidinones such as 1,3-dimethyl-2-imidazolidinone, 1,3-diethyl-2-imidazolidinone, and 1,3-diisopropyl-2-imidazolidinone, lactones such as γ-butyrolactone and δ-valerolactone, polyhydric alcohols such as ethylene glycol, ethylene glycol monomethyl ether, ethylene glycol monoethyl ether, ethylene glycol monobytyl ether, ethylene glycol monomethyl ether acetate, ethylene glycol monoethyl ether acetate, diethylene glycol, diethylene glycol monomethyl ether, diethylene glycol monoethyl ether, diethylene glycol monobytyl ether, and diethylene glycol ethyl methyl ether, and their derivatives. Among these materials, at least a material selected from the group consisting of dimethyl sulfoxide, N-methyl-2-pyrolidone, 1,3-dimethyl-2-imidazolidinone, and diethylene glycol ethyl methyl ether is preferable from the viewpoint of excellent removability of the layer of the silane coupling agent. These water-soluble organic solvents may be used alone or two or more of them may be used in combination.

In consideration of the contents of hydrogen fluoride and ammonium fluoride, the content of the water-soluble organic solvent in the cleaning solution is preferably 30.00 mass % or more and 99.45 mass % or less, more preferably 50.00 mass % or more and 90.00 mass % or less, and much more preferably 60.00 mass % or more and 80.00 mass % or less.

The cleaning solution may contain water as the solvent. In the case where the cleaning solution contains water, suppose the sum of the contents of hydrogen fluoride, ammonium fluoride, the water-soluble organic solvent, and water is 100 mass %, the content of water is a balance of the contents of hydrogen fluoride, ammonium fluoride, and the water-soluble organic solvent. However, since water easily induces corrosion of the terminals as compared to the water-soluble organic solvent, the content of water in the cleaning solution is preferably 50.00 mass % or less and more preferably 35.00 mass % or less. The cleaning solution may contain no water. In other words, the content of water may be 0 mass %. The cleaning solution may be comprised of hydrogen fluoride, ammonium fluoride, the water-soluble organic solvent, and water.

The cleaning solution may contain other additives as long as advantages of the present invention are not impaired. Examples of other additives include a compatibilizer, a surfactant, and an anti-corrosive agent. The cleaning solution may contain one of these additives or two or more of these additives.

The cleaning method using the cleaning solution is not specifically limited, and a method in which the substrate 1 is immersed in the cleaning solution can be employed, for example. From the viewpoint of obtaining a sufficient cleaning effect, the temperature of the cleaning solution is preferably 10 to 90° C. and more preferably 20 to 50° C. The cleaning time is preferably 1 to 180 minutes and more preferably 3 to 60 minutes. After the cleaning with the cleaning solution, the cleaning solution may be removed with, for example, pure water.

The cleaning step using the cleaning solution may be performed at any time after the silane coupling agent has adhered to the terminals and before electrical bonding of the terminals to an external device is performed. For example, the cleaning step may be performed after the intermediate layer 5 has been formed by applying a photosensitive material containing a silane coupling agent onto the substrate 1 including an upper surface of the terminals, exposing the photosensitive material to light, and developing the photosensitive material to cause the terminals to be exposed. Alternatively, the cleaning step may be performed by forming the intermediate layer 5 and then performing a treatment on the intermediate layer 5 and an upper surface of the substrate 1 with a silane coupling agent to form the flow path member 8. However, in consideration of the influence on production of the liquid ejection head, the cleaning is preferably performed immediately after the step of forming the intermediate layer 5. The term of immediately after the step of forming the intermediate layer 5 refers to a point of time immediately after development (wet etching) of the layer 19 to be an intermediate layer or, in the case of performing a rinsing process or post bake after the development, refers to a point of time immediately after the rinsing process and the post bake.

Subsequently, as illustrated in FIG. 2F, a mold 7 is formed on the substrate 1. The mold 7 is a mold for the flow path 13 having a portion that is to be the flow path 13 of liquid by removing this portion in a subsequent step. The mold 7 can be made of a resin or a metal. In particular, in terms of removability and patternability, the mold 7 is preferably made of a positive-type photosensitive resin. Examples of the positive-type photosensitive resin include vinyl ketone-based resins such as polymethyl isopropenyl ketone and polyvinyl ketone, and photo-degradation macromolecular compounds such as an acrylic compound. Examples of the acrylic photo-degradation macromolecular compound include a copolymer of methacrylate and methacrylate methyl, and a copolymer of methacrylate, methacrylate methyl, and methacrylate anhydride. These materials may be used alone or two or more of these materials may be used in combination. The mold 7 can be formed by applying a material for the mold 7 by, for example, spin coating or slit coating and then patterning the material, for example. The thickness of the mold 7 can be selected based on a desired height of the flow path, and is preferably 2 μm or more and 50 μm or less.

Figure 2G:
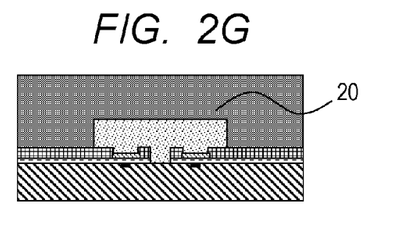

Then, as illustrated in FIG. 2G, a coating layer 20 is formed to cover the mold 7. The coating layer 20 is a layer to be a flow path member 8. The coating layer 20 is located above the intermediate layer 5, and is in contact with the intermediate layer 5 in a portion where the mold 7 is not present. That is, in FIG. 2G, the intermediate layer 5 is in contact with the inorganic material layer 3 and the coating layer 20 between the inorganic material layer 3 and the coating layer 20.

The coating layer 20 contains an organic material and can be formed by using a resin composition. In consideration of mechanical strength, resistance to liquid (ink), and resolution, for example, the resin composition is preferably a cationic polymerization epoxy resin composition. The cationic polymerization epoxy resin composition is preferably a cationic photopolymerization epoxy resin composition containing, for example, a bisphenol A epoxy resin, a phenol novolac epoxy resin, a cresol novolac epoxy resin, a polyfunctional epoxy resin having an oxycyclohexane skeleton. The use of an epoxy resin having two or more functional groups as the epoxy resin enables three-dimensional bridge of a cured material so that desired properties can be easily obtained. Examples of such an epoxy resin include "Celloxide 2021," "GT-300 series," "GT-400 series," and "EHPE3150" (trade names, produced by Daicel Corporation), "157S70" (trade name, produced by Mitsubishi Chemical Corporation), and "Epiclon N-865" (trade name, produced by DIC Corporation). These materials may be used alone or two or more of these materials may be used in combination.

The epoxy resin composition preferably contains a photopolymerization initiator. Examples of the photopolymerization initiator include a sulfonic acid compound, a diazomethane compound, a sulfonium salt compound, an iodonium salt compound, and a disulfone-based compound. Commercially available examples of the photopolymerization initiator include "Adeka Optomer SP-170," "Adeka Optomer SP-172," and "SP-150" (trade names, produced by ADEKA), "BBI-103" and "BBI-102" (trade names, produced by Midori Kagaku Co., Ltd.), and "IBPF," "IBCF," "TS-01," and "TS-91" (trade names, produced by SANWA CHEMICAL CO., LTD.). These materials may be used alone or two or more of these materials may be used in combination. The epoxy resin composition can contain basic substances such as amines, a photosensitizer such as an anthracene derivative, and a silane coupling agent, for example, in order to enhance photolithographic properties and adhesion performance.

As a material for the coating layer 20, commercially available negative-type resists such as "SU-8 series" (trade name, produced by Nippon Kayaku Co., Ltd.), "TMMR 52000" and "TMMF 52000" (trade names, produced by TOKYO OHKA KOGYO CO., LTD.) may be used.

The method for forming the coating layer 20 can be, for example, a method for dissolving the resin composition in a solvent and applying the resulting solvent by, for example, spin coating. Such a solvent can be an organic solvent. Specifically, examples of the solvent include alcohol-based solvents such as ethanol and isopropyl alcohol, ketone-based solvents such as acetone, methyl isobutyl ketone, di-isobutyl ketone, and cyclohexanone, aromatic solvents such as toluene, xylene, and mesitylene, lactic acid ethyl, propylene glycol monomethyl ether, diethylene glycol monomethyl ether, and diethylene glycol dimethyl ether. These materials may be used alone or two or more of these substances may be used in combination.

In the case where the flow path member 8 has the ejection orifice 10, the thickness of the coating layer 20 on the mold 7 is preferably 3 µm or more, from the viewpoint of mechanical strength, for example. The thickness of the coating layer 20 on the mold 7 is not specifically limited as long as the ability of development at the ejection orifice 10 is not impaired, but is preferably 100 µm or less. The thickness of the coating layer 20 on the substrate 1 is preferably 5 µm or more and 120 µm or less. The surface of the coating layer 20 may be subjected to a surface modification treatment such as a water-repellent treatment or a hydrophilization treatment. In particular, in the case where the flow path member 8 has the ejection orifice 10, the surface modification treatment is preferably performed on the ejection orifice surface in which the ejection orifice 10 is open.

Figure 2H:
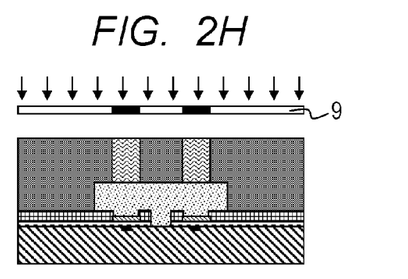

Thereafter, as illustrated in FIG. 2H, the coating layer 20 is exposed to light using the mask 9. For example, in a case where the coating layer 20 contains a negative-type photosensitive resin, for example, the light exposure can be performed with, for example, an i-ray exposure stepper by using the mask 9 having a pattern of the ejection orifice 10. The mask 9 may be a mask obtained by forming a light-shielding film such as a chromium film in accordance with the pattern on a substrate made of, for example, glass or quartz through which light having an exposure wavelength passes, in a manner similar to that of the mask 6 described above. Then, the coating layer 20 is subjected to a heat treatment (PEB) at a temperature greater than or equal to a softening point of an organic material, thereby curing the exposed portion.

Figure 2I:
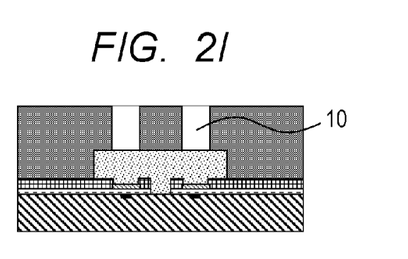

Subsequently, as illustrated in FIG. 2I, the unexposed portion of the coating layer 20 is developed with a developer, and an ejection orifice 10 is formed in the coating layer 20. Examples of the developer include methyl isobutyl ketone (MIBK) and xylene. These materials may be used alone or two or more of these materials may be used in combination. After the development, a rinsing process using isopropyl alcohol (IPA) and/or post bake may be performed as necessary.

Figure 2J:
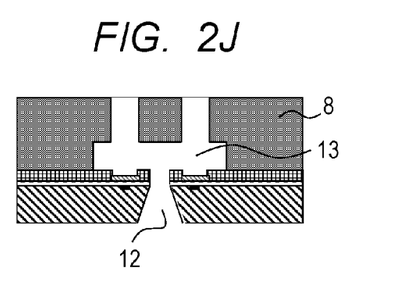

Then, as illustrated in FIG. 2J, a supply part 12 is formed in the substrate 1. The supply part 12 can be formed in the substrate 1 by wet etching using an alkaline etchant such as tetramethylammonium hydroxide (TMAH) and KOH or reactive ion etching. In the case of performing wet etching, the surface of the substrate 1 can be coated with a protective layer in order to protect the coating layer 20, for example, against the etchant. In addition, the mold 7 is removed so that a flow path 13 is formed. The mold 7 can be removed by dissolution using, for example, lactic acid methyl. The removal by dissolution of the mold 7 may be performed with application of ultrasonic waves, as necessary. In this manner, a flow path member 8 is formed.

Then, the flow path member 8 is subjected to a heat treatment at, for example, 150° C. or more so that the flow path member 8 is sufficiently cured. Thereafter, the substrate 1 is divided by cutting. Lastly, members are joined for liquid supply, and electrical bonding for driving the energy-generating elements 2, for example, is performed on the terminals, thereby obtaining a liquid ejection head.

Examples of the method for performing electrical bonding to an external device include TAB mounting of connecting inner leads of tape automated bonding (TAB) tapes to bumps on the terminals of the substrate 1 (ILB process), and then sealing the connecting portions. The TAB mounting enables thinner mounting than wire bonding, and is preferable for electrical bonding of a liquid ejection head. The bumps refer to bump electrodes provided on the terminals for convenience of electrical connection. The bumps are formed by electrolytic plating or electroless plating, for example, and are made of a gold, for example.

Figure 3:
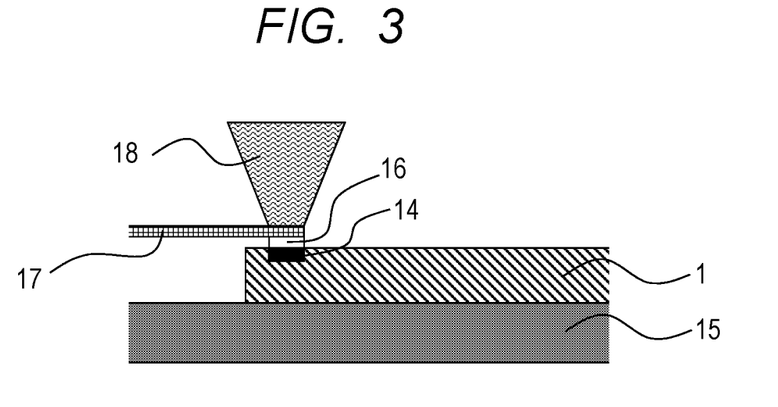
FIG. 3 is a sectional view illustrating an example of a method for electrically connecting a liquid ejection head according to the present invention.

Examples of the ILB process for connecting the inner leads of the TAB tapes to the bumps of the substrate 1 include single point bonding and gang bonding for bonding a plurality of inner leads to the bumps at a time. The electrical bonding of the liquid ejection head can employ single point bonding. As illustrated in FIG. 3, an ILB bonder used in this method includes a chip stage 15 fixedly holding the substrate 1 and heating a bump 16 provided on a terminal 14 of the substrate 1 and a bonding tool 18 which is disposed above the chip stage 15 and to which ultrasonic waves are transmitted by a horn. An inner lead 17 of a TAB tape is positioned with respect to the bump 16 on the substrate 1 fixed to the chip stage 15 and heated by the chip stage 15, and is brought into contact with the bump 16, and the bonding tool 18 is pressed against the inner lead 17. A load is applied to the bonding tool 18 with vibrations of ultrasonic waves so that the inner lead 17 of the TAB tape is joined to the bump 16. The bonding tool 18 is preferably a bonding tool whose tip has a cross-pattern projection because this bonding tool shows high grip performance to the inner lead 17.

At this time, if the silane coupling agent remains on the terminal 14, the bonding strength decreases so that the inner lead 17 is readily detached. Although the bonding strength can be enhanced by, for example, increasing the intensity of ultrasonic waves, problems such as cracks occur in the terminal 14 itself. Similarly, in a case where corrosion of the terminal 14 occurs, a decrease in bonding strength occurs. In a case where corrosion reaches a wiring portion, a failure in current-carrying might occur. As described above, in the method according to the present invention, the silane coupling agent remaining on the terminal 14 can be effectively removed without occurrence of corrosion of the terminal 14, for example. Thus, the bonding strength can be enhanced so that detachment of the inner lead 17 can be suppressed.

EXAMPLES

Examples of the present invention will be described hereinafter, and the present invention will be described in further detail. However, the present invention is not limited to these examples.

<Preparation of Cleaning Solution>

Materials shown in Table 1 were mixed so that cleaning solutions for use in Examples 1 to 15 and Comparative Examples 1 to 5 were obtained. The unit in Table 1 is parts by mass.

TABLE 1

| Ingredient | | Examples | | | | | | | | | |
|---|---|---|---|---|---|---|---|---|---|---|---|
| | | 1 | 2 | 3 | 4 | 5 | 6 | 7 | 8 | 9 | 10 |
| Hydrogen fluoride | | 0.10 | 0.10 | 0.10 | 0.05 | 1.00 | 5.00 | 0.10 | 0.01 | 10.00 | 3.00 |
| Ammonium fluoride | | 1.00 | 1.00 | 1.00 | 0.70 | 1.00 | 10.00 | 0.50 | 0.15 | 20.00 | 1.00 |
| Water-soluble organic solvent | (1) | 68.90 | | | 69.25 | 68.00 | 60.00 | 69.40 | 69.84 | 50.00 | 66.00 |
| | (2) | | 68.90 | | | | | | | | |
| | (3) | | | 68.90 | | | | | | | |
| | (4) | | | | | | | | | | |
| | (5) | | | | | | | | | | |
| Others | (6) | 30.00 | 30.00 | 30.00 | 30.00 | 30.00 | 25.00 | 30.00 | 30.00 | 20.00 | 30.00 |
| | (7) | | | | | | | | | | |

| Ingredient | | Examples | | | | | Comparative Examples | | | | |
|---|---|---|---|---|---|---|---|---|---|---|---|
| | | 11 | 12 | 13 | 14 | 15 | 1 | 2 | 3 | 4 | 5 |
| Hydrogen fluoride | | 0.10 | 1.00 | 0.10 | 0.10 | 0.10 | | 1.00 | | | 0.10 |
| Ammonium fluoride | | 0.10 | 1.00 | 1.00 | 1.00 | 1.00 | 3.00 | | 5.00 | | 1.00 |
| Water-soluble organic solvent | (1) | 69.80 | 98.00 | 68.90 | 68.90 | 68.90 | 67.00 | 69.00 | | | |
| | (2) | | | | | | | | | | |
| | (3) | | | | | | | | | 50.00 | |
| | (4) | | | | | | | | | 20.00 | |
| | (5) | | | | | | | | | 30.00 | |
| Others | (6) | 30.00 | | 30.00 | 30.00 | 30.00 | 30.00 | 30.00 | 90.00 | | 98.90 |
| | (7) | | | | | | | | 5.00 | | |

Symbols in Table 1 are as follows:
(1) dimethyl sulfoxide
(2) N-methyl-2-pyrolidone
(3) diethylene glycol ethyl methyl ether
(4) ethanol amine
(5) diethylene glycol ether
(6) water
(7) hydrogen chloride.

Example 1

<Fabrication of Liquid Ejection Head>

First, as illustrated in FIG. 2A, a substrate 1 made of silicon and including energy-generating elements 2 was prepared. Although not shown in FIG. 2A, in a manner similar to the substrate 1 illustrated in FIG. 1A, the substrate 1 included terminals 14 of aluminium.

Next, as illustrated in FIG. 2B, a SiCN layer having a thickness of 1.0 μm to be an inorganic material layer 3 was formed by plasma CVD on the substrate 1 to cover the energy-generating elements 2. Then, a Ta layer having a thickness of 0.25 μm to be a protective layer 4 was formed by sputtering. Thereafter, the SiCN layer and the Ta layer were patterned by photolithography and reactive ion etching, thereby forming an inorganic material layer 3 and a protective layer 4. To electrically connecting circuit wiring to an external device, the inorganic material layer 3 and the protective layer 4 have openings at locations corresponding to terminals 14.

Subsequently, as illustrated in FIG. 2C, a layer 19 to be an intermediate layer was formed on the inorganic material layer 3 and the protective layer 4. First, a silane coupling agent (produced by Momentive Performance Materials Inc., trade name: A-187) was applied with a spin coater, then dried by prebake at 90° C. for three minutes, and was subjected to a treatment with a silane coupling agent. Then, a photosensitive material having a composition shown in Table 2 was applied with a spin coater, was dried by performing prebake at 90° C. for five minutes, thereby forming a layer 19 to be an intermediate layer having a thickness of 2.0 μm.

TABLE 2

| Photosensitive resin | Trade name: GT-401 (epoxy resin), produced by Daicel Corporation | 100 parts by mass |
|---|---|---|
| Photopolymerization initiator | Trade name: Adeka Optomer SP-172, produced by ADEKA | 6 parts by mass |
| Silane coupling agent | Trade name: A-187, produced by Momentive Performance Materials Inc. | 5 parts by mass |
| Solvent | Propylene glycol monoethyl ether, produced by KANTO CHEMICAL CO., INC. | 100 parts by mass |

Thereafter, as illustrated in FIG. 2D, the layer 19 to be an intermediate layer was exposed to light using a mask 6 with an i-ray exposure stepper (produced by Canon Inc., trade name: i5), and then was subjected to heating (PEB) at 90° C. for four minutes with a hot plate.

Subsequently, as illustrated in FIG. 2E, an unexposed portion of the layer 19 to be an intermediate layer was developed with methyl isobutyl ketone (MIBK), thereby forming an intermediate layer 5. At this time, to electrically connect circuit wiring to an external device, an opening was formed in a portion of the intermediate layer 5 corresponding to terminals. Then, after heating had been performed at 150° C. for four minutes, cleaning for removing a silane coupling agent was performed using cleaning solution having a composition shown in Table 1. This cleaning was performed at 30° C. for five minutes using the cleaning solution, and then the cleaning solution was washed out at 30° C. for 10 minutes using pure water. Thereafter, in addition to spin drying, drying was performed at 120° C. for 30 minutes so that moisture on the substrate 1 was sufficiently removed.

Then, as illustrated in FIG. 2F, a mold 7 for forming a flow path was formed on the substrate 1. Specifically, polymethyl isopropenyl ketone (produced by TOKYO OHKA KOGYO CO., LTD., trade name: ODUR-1010) was applied to a thickness of 12 µm. Thereafter, the applied film was patterned with a Deep-UV exposure device (produced by USHIO INC., trade name: UX3000), thereby forming a mold 7.

Subsequently, as illustrated in FIG. 2G, a coating layer 20 to be a flow path member 8 was formed to cover the mold 7. Specifically, a negative-type photosensitive resin (produced by Nippon Kayaku Co., Ltd., trade name: SU-8-3025) was applied on the mold 7 to a thickness of 25 µm from the surface of the substrate 1 and to a thickness of 13 µm from the surface of the mold 7. Thereafter, prebake was performed at 90° C. for five minutes to perform drying, thereby forming a coating layer 20.

Then, as illustrated in FIG. 2H, the coating layer 20 was exposed to light using the mask 9 with an f-ray exposure stepper (produced by Canon Inc., trade name: i5). Thereafter, PEB was performed at 90° C. for four minutes with a hot plate.

Then, as illustrated in FIG. 2I, the unexposed portion of the coating layer 20 was developed with an MIBK (methyl isobutyl ketone), thereby forming an ejection orifice 10 in the coating layer 20.

Thereafter, as illustrated in FIG. 2J, a supply part 12 was formed in the substrate 1, and a flow path 13 was formed by removing the mold 7. Specifically, an etching mask having a rectangular opening with a width of 1 mm and made of a polyether amide resin composition (produced by Hitachi Chemical Company, Ltd., trade name: HIMAL1200) was formed on the back surface of the substrate 1. Then, the substrate 1 was immersed in a 22 mass % of tetramethylammonium hydroxide (TMAH) aqueous solution held at 80° C., and was subjected to anisotropic etching (wet etching), thereby forming a supply part 12 in the substrate 1. In forming the supply part 12, the front surface of the substrate 1 was covered with a protective layer (produced by TOKYO OHKA KOGYO CO., LTD., trade name: OBC) in order to protect the coating layer 20, for example, against the TMAH aqueous solution. The protective layer was removed by dissolution by using xylene after the formation of the supply part 12. Then, the entire surface of the substrate was exposed to light using a Deep-UV exposure device (produced by USHIO INC., trade name: UX-3000). Thereafter, the substrate 1 was immersed in lactic acid methyl with application of ultrasonic waves and the mold 7 was removed by dissolution, thereby forming a flow path 13. In this manner, a flow path member 8 was formed.

Subsequently, the flow path member 8 was subjected to a heat treatment at 200° C. for 60 minutes to be cured, and then, the substrate 1 was divided by cutting. Lastly, members were joined for liquid supply, and electrical bonding for driving the energy-generating elements 2, for example, was performed on the terminals. The electrical bonding was performed in a manner illustrated in FIG. 3. The substrate 1 was placed on the chip stage 15 of an ILB bonder placed in a room, and was adsorbed onto the chip stage 15. The temperature was adjusted such that the front surface of the substrate 1 was at 150° C., and a bump 16 provided on a terminal 14 of the substrate 1 and an inner lead 17 obtained by coating a rolling copper having a lead width of 60 µm and a thickness of 23 µm with a gold plating having a thickness of 1 µm or more were bonded together with a bonding tool 18. As the bonding tool 18, a tool having a slot structure including two slots perpendicularly intersecting at a tip thereof, i.e., a so-called slot-shaped gaiser tool, was used. Bonding conditions were that a bonding load was 110 g, ultrasonic power was about 260 mW, and ultrasonic oscillation time was 15 ms. In this manner, a liquid ejection head was manufactured.

<Evaluation of Bonding Strength>

A tensile strength of an inner lead of the obtained liquid ejection head was measured, and a bonding strength was evaluated based on the following criteria. Table 4 shows evaluation results.

A: The minimum value of the tensile strength of the inner lead was 15 gf (0.15 N) or more.
B: The minimum value of the tensile strength of the inner lead was 10 gf (0.10 N) or more and less than 15 gf (0.15 N).
C: The minimum value of the tensile strength of the inner lead was less than 10 gf (0.10 N), or the inner lead was detached from an initial stage.

Examples 2 to 15 and Comparative Examples 1 to 5

A liquid ejection head was fabricated and evaluated in the same manner as that in Example 1 except for using a cleaning solution having a composition shown in Table 1. Table 4 shows evaluation results. In Example 13, a photosensitive material having a composition shown in Table 3(a) was used as a material for the layer 19 to be an intermediate layer. In Example 14, a photosensitive material having a composition shown in Table 3(b) was used as a material for the layer 19 to be an intermediate layer. In Example 15, a photosensitive material having a composition shown in Table 3(c) was used as a material for the layer 19 to be an intermediate layer.

TABLE 3(a)

| | | |
|---|---|---|
| Photosensitive resin | Trade name: 157S70 (epoxy resin), produced by Mitsubishi Chemical Corporation | 100 parts by mass |
| Photopolymerization initiator | Trade name: Adeka Optomer SP-172, produced by ADEKA | 6 parts by mass |
| Silane coupling agent | Trade name: A-187, produced by Momentive Performance Materials Inc. | 5 parts by mass |
| Solvent | Propylene glycol monoethyl ether, produced by KANTO CHEMICAL CO., INC. | 100 parts by mass |

TABLE 3(b)

| | | |
|---|---|---|
| Photosensitive resin | Trade name: VG3101 (epoxy resin), produced by Printec Co. Ltd. | 100 parts by mass |
| Photopolymerization initiator | Trade name: Adeka Optomer SP-172, produced by ADEKA | 6 parts by mass |
| Silane coupling agent | Trade name: A-187, produced by Momentive Performance Materials Inc. | 5 parts by mass |
| Solvent | Propylene glycol monoethyl ether, produced by KANTO CHEMICAL CO., INC. | 100 parts by mass |

TABLE 3(c)

| | | |
|---|---|---|
| Photosensitive resin | Trade name: GT-401 (epoxy resin), produced by Daicel Corporation | 100 parts by mass |
| Photopolymerization initiator | Trade name: CPI-410, produced by San-Apro Ltd. | 6 parts by mass |
| Silane coupling agent | Trade name: KBM-303, produced by Shin-Etsu Chemical Co., Ltd. | 5 parts by mass |
| Solvent | Propylene glycol monoethyl ether, produced by KANTO CHEMICAL CO., INC. | 100 parts by mass |

TABLE 4

| Evaluation items | Examples | | | | | | | | | | | | | | | Comparative Examples | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 1 | 2 | 3 | 4 | 5 |
| Bonding strength | A | A | A | A | A | A | A | B | B | B | B | A | A | A | A | C | C | C | C | C |

As shown in Table 4, the liquid ejection heads of Examples 1 to 15 showed high bonding strength after lead bonding. On the other hand, the liquid ejection heads of Comparative Examples 1 to 5 showed low bonding strength after lead bonding. A comparison between Examples 4 and 6 and Examples 8 and 9 shows that the content of hydrogen fluoride in the cleaning solution according to the present invention is preferably 0.05 mass % or more and 5.00 mass % or less. A comparison between Example 7 and Example 11 shows that the content of ammonium fluoride in the cleaning solution according to the present invention is preferably 0.5 mass % or more. A comparison between Example 1 and Example 10 shows that in the cleaning solution according to the present invention, the mass ratio (ammonium fluoride/hydrogen fluoride) between hydrogen fluoride and ammonium fluoride in the cleaning solution is preferably to (one) or more. A comparison among Examples 1, 13, 14, and 15 shows that the cleaning solution according to the present invention shows excellent advantages, independently of the composition of the intermediate layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-101851, filed May 19, 2015, which is hereby incorporated by reference herein in its entirety.

What is claimed is:

1. A method for manufacturing a liquid ejection head including:
a substrate having a terminal, the terminal being a point for electrical connection to an external device;
an inorganic material layer on the substrate;
a flow path member disposed on the inorganic material layer and containing an organic material; and
an intermediate layer disposed between the inorganic material layer and the flow path member,
the manufacturing method comprising:
a step of forming the intermediate layer by applying a photosensitive material containing a silane coupling agent onto the substrate including an upper surface of the terminal, by exposing the photosensitive material to light, and by developing the exposed photosensitive material, wherein the photosensitive material applied on the upper surface of the terminal is removed and the terminal is exposed; and
a step of cleaning the upper surface of the terminal immediately after the step of forming the intermediate layer by using a solution containing hydrogen fluoride, ammonium fluoride, and a water-soluble organic solvent.

2. The method of claim 1, wherein in the solution, a content of hydrogen fluoride is 0.05 mass % to 15.00 mass %, a content of ammonium fluoride is 0.50 mass % to 20.00 mass %, a content of the water-soluble organic solvent is 30.00 mass % to 99.45 mass %, and a balance is water, where a sum of contents of hydrogen fluoride, ammonium fluoride, the water-soluble organic solvent, and water is 100 mass %, and a content of water includes 0 mass %.

3. The method of claim 1, wherein a mass ratio (ammonium fluoride/hydrogen fluoride) of hydrogen fluoride and ammonium fluoride contained in the solution is 1 to 15.

4. The method of claim 1, wherein the water-soluble organic solvent is at least one material selected from the group consisting of dimethyl sulfoxide, N-methyl-2-pyrrolidone, 1,3-dimethyl-2-imidazolidinone, and diethylene glycol ethyl methyl ether.

5. The method of claim 1, further comprising treating the intermediate layer and an upper surface of the substrate with a silane coupling agent.

6. The method of claim 1, further comprising a step of performing a treatment on an upper surface of the substrate including an upper surface of the terminal with a silane coupling agent.

7. The method of claim 1, wherein the terminal contains aluminum.

8. The method of claim 1, wherein a content of water in the solution is 50.00 mass % or less.

9. The method of claim 1, wherein a content of water in the solution is 35.00 mass % or less.

10. The method of claim 1, wherein the terminal is disposed outside the flow path member.

11. The method of claim 1, wherein the liquid ejection head further includes an energy-generating element for generating energy for ejecting liquid,
   wherein the method further comprises a step of electrically connecting a circuit wiring to the external device through the terminal after the cleaning step, and
   wherein the circuit wiring is a circuit wiring for driving the energy-generating element.

12. The method of claim 1, wherein the water-soluble organic solvent comprises dimethyl sulfoxide.

\* \* \* \* \*